United States Patent [19]

Kurosawa

[11] Patent Number: 4,497,108

[45] Date of Patent: Feb. 5, 1985

[54] METHOD FOR MANUFACTURING SEMICONDUCTOR DEVICE BY CONTROLLING THICKNESS OF INSULATING FILM AT PERIPHERAL PORTION OF ELEMENT FORMATION REGION

[75] Inventor: Kei Kurosawa, Tokyo, Japan

[73] Assignee: Tokyo Shibaura Denki Kabushiki Kaisha, Kawasaki, Japan

[21] Appl. No.: 495,483

[22] Filed: May 17, 1983

[30] Foreign Application Priority Data

May 21, 1982 [JP] Japan ................... 57-85726

[51] Int. Cl.³ .............................. H01L 21/76
[52] U.S. Cl. .................. 29/576 W; 29/571; 29/578; 156/643; 357/49
[58] Field of Search ............. 29/571, 576 W, 578; 156/643; 357/49, 54, 55, 53

[56] References Cited

U.S. PATENT DOCUMENTS 4,419,813  12/1983  Iwai .......................... 29/571 X

OTHER PUBLICATIONS

Preprints for 29-th Applied Physics Meeting 691 (1982) Ogawa et al.
K. Kurosawa, T. Shibata and H. Iizuka, "A New Bird's-Beak Free Field Isolation Technology for VLSI Devices" IEDM Techn. Digest, 384-387 (1981).

Primary Examiner—Brian E. Hearn
Assistant Examiner—Alan E. Schiavelli
Attorney, Agent, or Firm—Oblon, Fisher, Spivak, McClelland & Maier

[57] ABSTRACT

A method of manufacturing a semiconductor device wherein a thickness of an insulating film at a peripheral portion of an element formation region of a semiconductor substrate is increased. The feature of this method is that an antioxidant film is formed on the element formation region and subsequently said semiconductor substrate is exposed to an oxygen atmosphere, thereby locally oxidizing that portion of the film which surrounds said element formation region.

4 Claims, 25 Drawing Figures

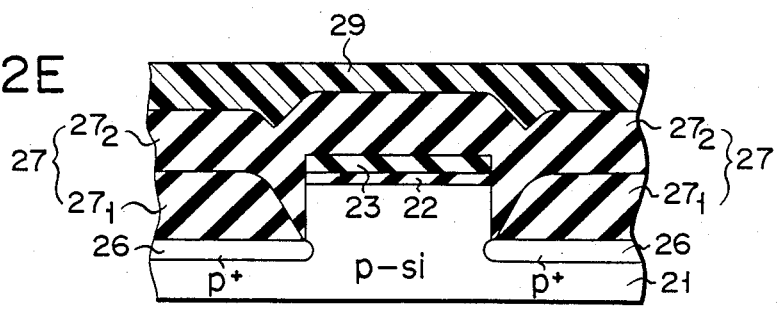
F I G. 2E
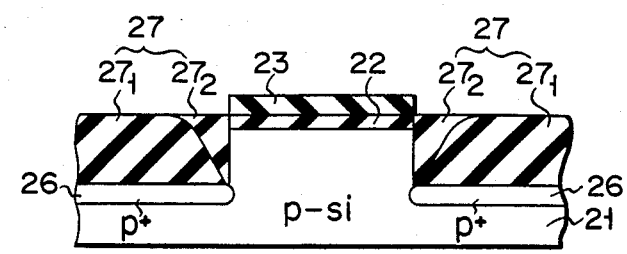
F I G. 2F
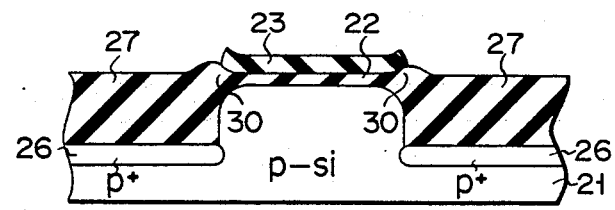
F I G. 2G
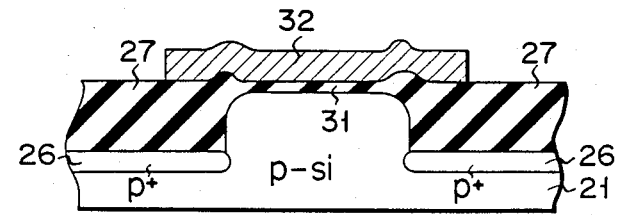
F I G. 2H

METHOD FOR MANUFACTURING SEMICONDUCTOR DEVICE BY CONTROLLING THICKNESS OF INSULATING FILM AT PERIPHERAL PORTION OF ELEMENT FORMATION REGION

BACKGROUND OF THE INVENTION

I. Field of the Invention

The present invention relates to a method for manufacturing a semiconductor device wherein a thick field insulating film is formed in a field region so as to have a flat surface, and the thickness of an insulating film at the peripheral portion of the element formation region is controlled.

II. Description of the Prior Art

In a conventional semiconductor device using silicon, particularly a MOS device, a thick insulating film is formed in a field region between element formation regions so as to prevent incomplete insulation due to a parasitic channel and to decrease parasitic capacitance in a junction.

Selective oxidation is generally used for element isolation. According to this technique, an antioxidant mask (typically, a silicon nitride film) is formed to cover a prospective element formation region. Thermal oxidation is then performed at a high temperature to leave a thick oxide film only in the field region. However, in selective oxidation, a field oxide film undercuts the silicon nitride film, thus forming a so-called "bird's beak" during oxidation at a high temperature. This results in a dimensional error of the element formation region and hence precludes a high packing density of the integrated circuit. Furthermore, a stepped portion which has a height of about 0.3 to 0.5 $\mu$m is formed at a boundary between the field region and the element formation region. This stepped portion results in the degradation of lithographic precision and poor step coverage of the wiring layer.

On the other hand, a liftoff technique is known which eliminates both the bird's beak and the stepped portion while forming a thick oxide film for element isolation. According to the liftoff technique, the field region is etched, thus forming a groove and a field oxide film is formed therein. A conventional liftoff technique will be briefly described with reference to FIGS. 1(A) to 1(G). As shown in FIG. 1(A), a thermal oxide film 12 is formed on a silicon substrate 11, and an Al film 13 is formed thereon. Thereafter, a photoresist film 14 is formed on the Al film 13 by photoetching. The thermal oxide film 12 and the Al film 13 are etched using the photoresist film 14 as a mask. After the photoresist film 14 is removed, the silicon substrate 11 is selectively etched by reactive ion etching (RIE) using the Al film 13 as a mask, thus forming a groove of a depth corresponding to the thickness of a prospective field insulating film, as shown in FIG. 1(B). Using the Al film 13 as a mask, a p-type impurity such as boron is ion-implanted in the exposed portion of the silicon substrate 11, thereby forming a p$^+$-type inversion preventive layer (field stopper) 15. It should be noted that the impurity has the same conductivity type as that of the silicon substrate but has a higher concentration. Thereafter, as shown in FIG. 1(C), a thick plasma CVD-SiO$_2$ film 16$_1$ is formed to cover the entire surface to a thickness greater than the depth of the groove. The CVD-SiO$_2$ film 16$_1$ is then etched by an aqueous solution of ammonium fluoride for one minute. A film portion of the CVD-SiO$_2$ film 16$_1$ which is formed on the side wall of the element formation region is etched faster than the remaining portion of the CVD-SiO$_2$ film 16$_1$. Therefore, the SiO$_2$ film on the side wall is selectively etched, so that a narrow groove is formed. Subsequently, the Al film 13 is removed to lift off the CVD-SiO$_2$ film portion thereon, thus obtaining a structure as shown in FIG. 1(D). As shown in FIG. 1(E), a CVD-SiO$_2$ film 16$_2$ is formed to cover the entire surface including the narrow groove. A photoresist film 17 is then applied to the entire surface so as to obtain a flat surface. It should be noted that the photoresist film is flowable and has the same etching rate as that of the CVD-SiO$_2$ films 16$_1$ and 16$_2$. As shown in FIG. 1(F), the photoresist film 17 and the CVD-SiO$_2$ films 16$_1$ and 16$_2$ are then uniformly etched to expose the element formation region. FIG. 1(G) shows a structure wherein a gate electrode 19 is formed through a gate oxide film 18 in the element formation region.

According to this conventional method, the size of the element formation region is defined by the size of a photoetched mask which is used for etching the silicon substrate 11 by reactive ion etching. Therefore, a dimensional error of the element formation region can be substantially eliminated. Furthermore, the field oxide film has a flat surface, thereby greatly improving lithographic precision and allowing good step coverage of the wiring layer.

However, when the conventional liftoff technique is used to manufacture an MOS transistor which has a gate width of 1 $\mu$m or less, a potential at an end of the substrate portion along a width W of the gate electrode 19 is increased with respect to a central substrate portion therealong, so that the obtained MOS transistor tends to have a low threshold voltage. The threshold voltage thus depends on the gate width, thereby precluding a high packing density. Furthermore, since the carriers are concentrated at the periphery of the element formation region, the MOS transistor is unstably operated, thus degrading element reliability.

SUMMARY OF THE INVENTION

It is an object of the present invention to provide a method for manufacturing a semiconductor device wherein carriers are not concentrated at a peripheral portion of an element formation region.

In order to achieve the above object of the present invention, there is provided a method for manufacturing a semiconductor device wherein a thickness of an insulating film at a peripheral portion of an element formation region is controlled, having a first step of forming a field insulating film in a groove so as to have a flat surface after an antietching mask is formed on said semiconductor substrate excluding a prospective field region and after said prospective field region is etched to form said groove, and a second step of forming a desired element in said element formation region isolated by said field insulating film, characterized in that the first step comprises the steps of:

(i) forming said antietching mask on said semiconductor substrate through an antioxidant film, said antietching mask being formed except at said prospective field region;

(ii) selectively etching said prospective field region to form said groove;

(iii) exposing said semiconductor substrate in an oxygen atmosphere while said antioxidant film is left thereon, thereby locally oxidizing a portion surrounding said element formation region; and (iv) depositing said field insulating film in said groove either before or after step (iii) so as to obtain the flat surface.

According to the method of the present invention, when a groove is formed by etching a portion of the semiconductor substrate which corresponds to the prospective field region, the antioxidant film is formed under the antietching mask. A field insulating film is selectively deposited in the groove to obtain a flat surface in the same manner as in the conventional method. However, according to the method of the present invention, either before or after the field insulating film is formed in the groove, or while the field insulating film is being formed in the groove, the exposed portion of the semiconductor substrate is exposed in an oxygen atmosphere using the antioxidant film, thereby oxidizing a portion around the element formation region. The oxide film slightly undercuts below the peripheral portion of the element formation region. After an oxide film is formed in the element formation region, the oxide film portion at the peripheral portion of the element formation region becomes thicker than that at the central portion thereof.

According to the present invention, when an MOS transistor is formed in the element formation region, the peripheral portion of the gate oxide film is thick and the central portion is thin along the gate width thereof. As a result, the potential at the peripheral portion of the element formation region is substantially the same as that at the central portion thereof. The threshold voltage of the MOS transistor cannot be decreased. Furthermore, carriers will not be concentrated at the peripheral portion of the element formation region, thereby improving the reliability of the device.

BRIEF DESCRIPTION OF THE DRAWINGS

FIGS. 2(A) to 2(H) are sectional views for explaining steps of a method for manufacturing a semiconductor device according to a first embodiment of the present invention;

DETAILED DESCRIPTION OF THE PREFERRED EMBODIMENTS

A method for manufacturing a MOS device according to a first embodiment of the present invention is explained below with reference to the drawings. FIGS. 2(A) to 2(H) are sectional views for explaining the steps of manufacturing this MOS device.

Figure 1A:
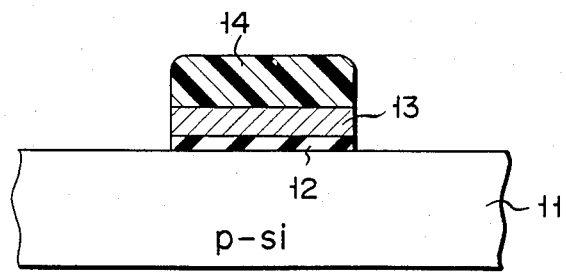
FIGS. 1(A) to 1(G) are sectional views for explaining steps of forming a field region for element isolation according to a conventional method.
Figure 1B:
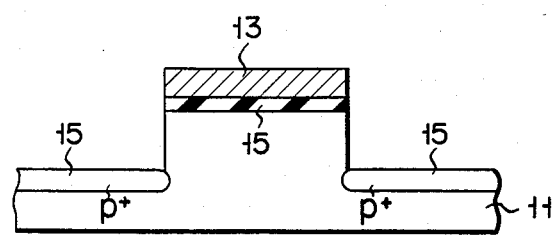
Figure 1C:
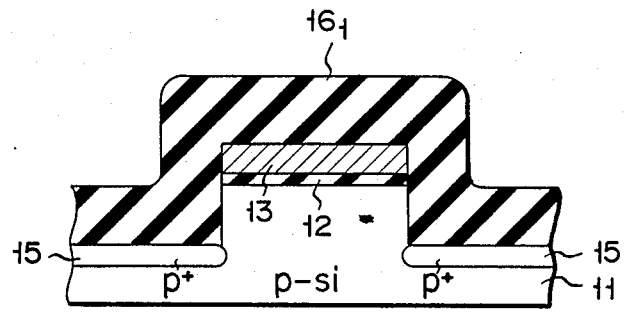
Figure 1D:
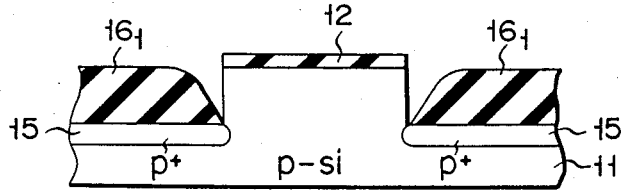
Figure 1E:
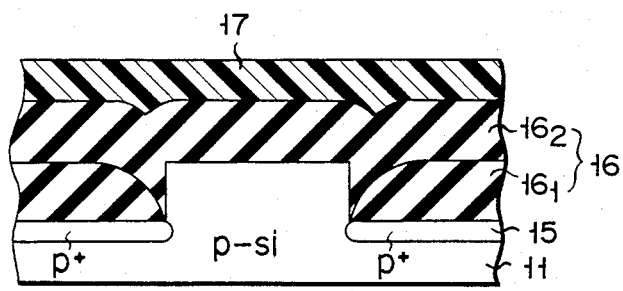
Figure 1F:
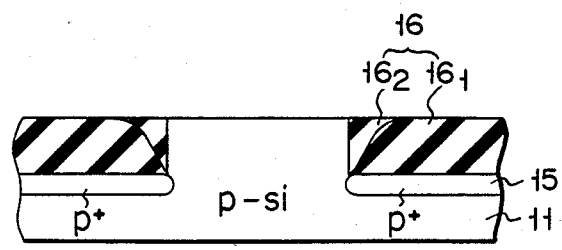
Figure 1G:
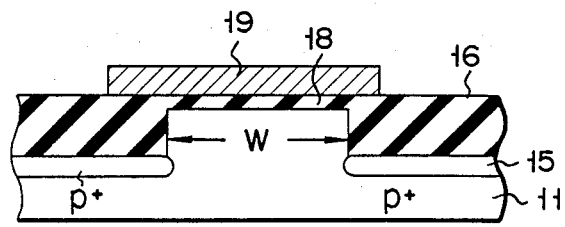
Figure 2A:
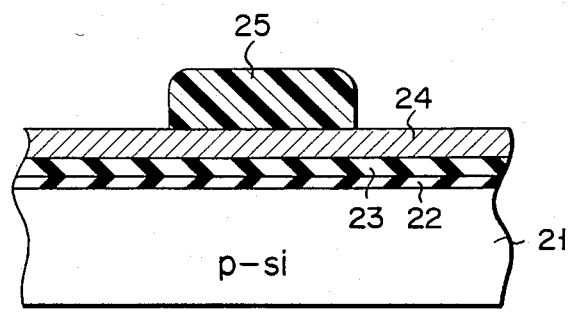
Figure 2B:
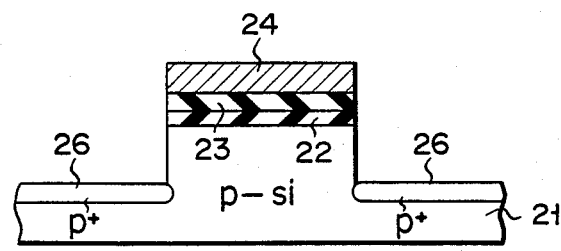
Figure 2C:
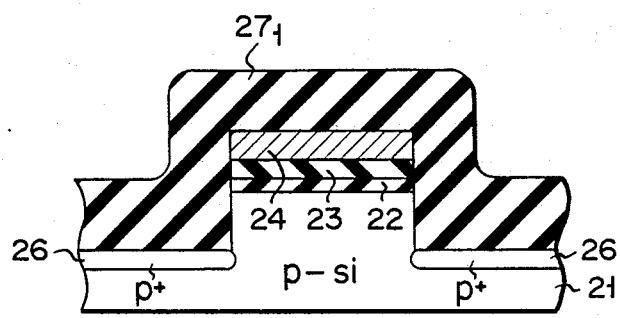
Figure 2D:
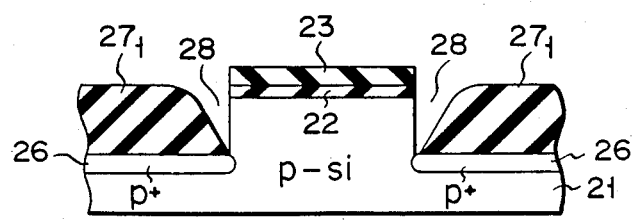

As shown in FIG. 2(A), a p-type silicon substrate 21 which has a plane (100) and a resistivity of 5 to 50 $\Omega$.cm is prepared. A thermal oxide film 22 is formed on the p-type silicon substrate 21 to a thickness of about 300 Å. A silicon nitride film 23 as an antioxidant film is then formed on the thermal oxide film 22 to a thickness of about 1,000 Å. An Al film 24 as an antietching mask and a liftoff material is formed on the silicon nitride film 23. A photoresist pattern 25 is formed on the Al film 24 by photoetching so as to correspond to a prospective element formation region. As shown in FIG. 2(B), the Al film 24, the silicon nitride film 23 and the oxide film 22 are sequentially etched using the photoresist pattern 25 as a mask. Thereafter, the exposed portion of the silicon substrate 21 is etched by reactive ion etching using $CF_4$ gas as an etchant, thus forming a groove. Thereafter, an impurity is ion-implanted in the groove, forming a field stopper (guard ring) 26. As shown in FIG. 2(C), a CVD-$SiO_2$ film $27_1$ as a first insulating film is deposited to cover the entire surface to a thickness slightly greater than the depth of the groove. A stepped portion is then selectively etched by ammonium fluoride, and the $SiO_2$ film $27_1$, together with the Al film 24, is lifted off by diluted hydrofluoric acid. As shown in FIG. 2(D), a structure is obtained wherein the CVD-$SiO_2$ film $27_1$ is selectively left in the groove of the field region, thereby forming a narrow groove 28 therein. Thereafter, as shown in FIG. 2(E), a CVD-$SiO_2$ film $27_2$ as a second insulating film is deposited to cover the entire surface including the narrow groove 28. A flowable photoresist film 29 is formed on the CVD-$SiO_2$ film $27_2$ so as to obtain a flat surface. The flowable photoresist film 29 and the CVD-$SiO_2$ film 27 ($27_1$ and $27_2$) are uniformly etched by reactive ion etching so as to leave a flat CVD-$SiO_2$ film 27 only in the field region, as shown in FIG. 2(F). Then, the obtained structure is annealed in a steam atmosphere at 1,000° C. for 30 minutes. A thermal oxide film 30 slightly undercuts below the silicon nitride film 23, as shown in FIG. 2(G). The silicon nitride film 23 is removed, and then the underlying thermal oxide film 22 is removed. Thereafter, a gate oxide film 31 is formed, and a gate electrode 32 is formed thereon, as shown in FIG. 2(H).

Figure 5:
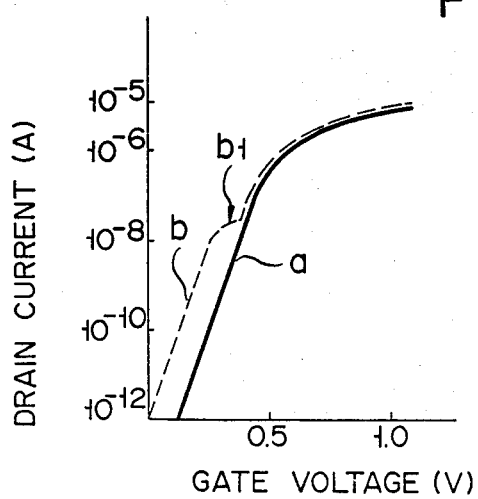
FIG. 5 is a graph for explaining the drain current as a function of the gate voltage of the semiconductor device of the present invention in comparison with the conventional semiconductor device.

According to the method described above, the peripheral portion of the thermal oxide film in the element formation region has a thickness greater than the central portion thereof, by about 0.1 to 0.2 $\mu$m, as shown in FIG. 2(H). Therefore, the potential at the peripheral portion of the element formation region under the gate oxide film is substantially the same as that at the central portion thereof. Even if the resultant transistor has a micropattern, its threshold voltage will not be decreased. For example, as shown in FIG. 5, a "hump" b1 is formed in a dotted curve b indicating the relationship between the drain current and gate voltage of the MOS transistor manufactured by the conventional method with reference to FIGS. 1(A) to 1(G). However, according to the method of the present invention with reference to FIGS. 2(A) to 2(H), the problem of the conventional method is eliminated as indicated by a solid curve a. Furthermore, the gate oxide film formed by the conventional method tends to break down due to carrier concentration at the peripheral portion along the width of the gate. However, according to the present invention, such a drawback is substantially eliminated, thereby greatly improving the yield of the semiconductor devices.

In the above embodiment, after the CVD-$SiO_2$ film 27 is deposited flat on the field region, the obtained structure is then exposed in an oxygen atmosphere, thereby forming the thermal oxide film 30 such that the peripheral portion of the thermal oxide film 22 together with the thermal oxide film 30 is thicker than the central portion thereof. However, this thermal oxide film 30 may also be formed either before or during deposition of the CVD-SiO$_2$ film 27 on the field region. These alternative methods for manufacturing the semiconductor substrate, according to third and fourth embodiments of the present invention, will be described with reference to FIGS. 3(A) to 3(D) and FIGS. 4(A) to 4(E), respectively.

Figure 3A:
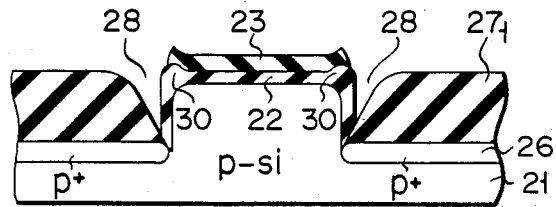
FIGS. 3(A) to 3(D) are sectional views for explaining steps of a method for manufacturing a semiconductor device according to a second embodiment of the present invention.
Figure 3B:
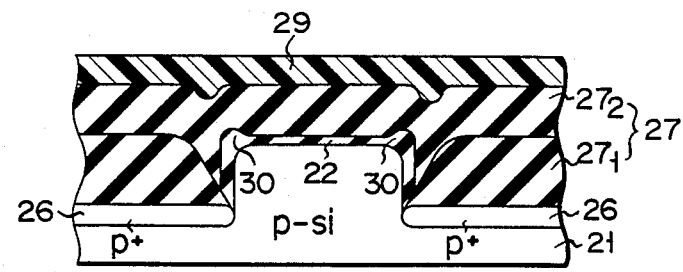
Figure 3C:
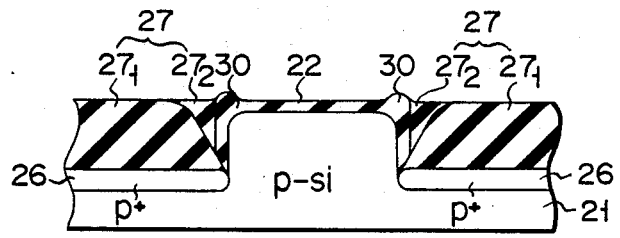
Figure 3D:
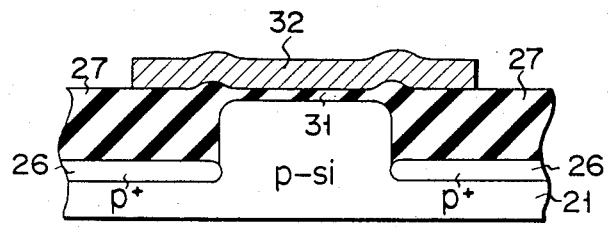

For example, after the structure shown in FIG. 2(D) is obtained, the resultant structure is exposed in an oxygen atmosphere, so that a thermal oxide film 30 may be formed as shown in FIG. 3(A). Thereafter, the silicon nitride film 23 as the antioxidant film is removed, and a CVD-SiO$_2$ film 27$_2$ and a flowable photoresist film 29 are formed on the structure shown in FIG. 3(A) so as to obtain a flat surface. The flowable photoresist film 29 and the CVD-SiO$_2$ film 27$_2$ are uniformly etched, as shown in FIG. 3(C). Thereafter, as shown in FIG. 3(D), a thermal oxide film 22 is removed and a gate oxide film 31 is formed.

Figure 4A:
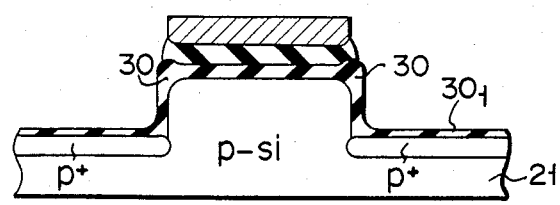
FIGS. 4(A) to 4(E) are sectional views for explaining steps of a method for manufacturing a semiconductor device according to a third embodiment of the present invention.
Figure 4B:
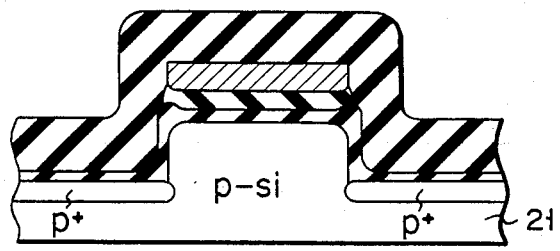
Figure 4C:
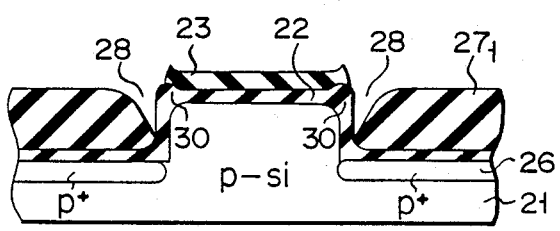
Figure 4D:
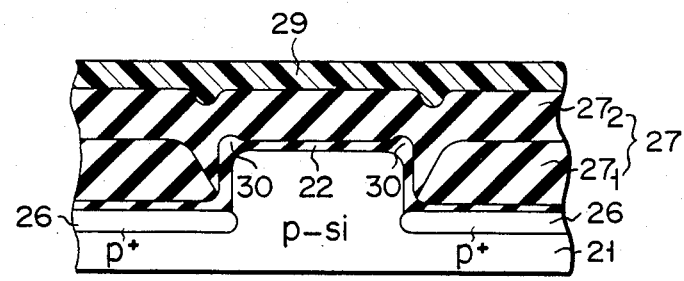
Figure 4E:
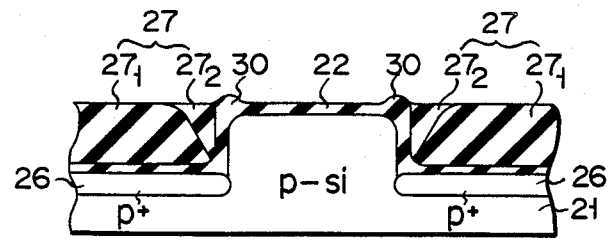

Alternatively, after the structure shown in FIG. 2(B) is obtained, the resultant structure is then exposed in an oxygen atmosphere in the same manner as in the previous embodiments, thereby forming a thick oxide film 30$_1$ on the exposed surface of the silicon substrate 21, as shown in FIG. 4(A). At the same time, a thermal oxide film 30 is also formed at the peripheral portion of the element formation region. An Al film 24 as a liftoff material must be properly selected in consideration of a temperature of thermal oxidation. As shown in FIG. 4(B), a CVD-SiO$_2$ film 27$_1$ as the first insulating film is deposited to cover the entire surface in the same manner as shown in FIG. 2(C). Thereafter, according to the liftoff technique, the CVD-SiO$_2$ film 27$_1$ is selectively left in the groove of the field region, thereby obtaining a narrow groove 28, as shown in FIG. 4(C). Thereafter, as shown in FIG. 4(D), a CVD-SiO$_2$ film 27$_2$ as the second insulating film is deposited to cover the entire surface, and a flowable photoresist film 29 is applied to obtain a flat surface. The flowable photoresist film 29 and the CVD-SiO$_2$ film 27 (27$_1$ and 27$_2$) are uniformly etched by reactive ion etching so as to leave a flat SiO$_2$ film 27 only in the field region, as shown in FIG. 4(E). Thereafter, as shown in FIGS. 2(H) and 3(D), the thermal oxide film 22 is removed, and a gate oxide film and a gate electrode are sequentially deposited thereon. The same effect as in the previous embodiments can be obtained in the above embodiment.

The present invention is applied to an MOS device. However, the present invention may also be applied to element isolation of a bipolar semiconductor device.

What is claimed is:

1. A method for manufacturing a semiconductor device wherein a thickness of an insulating film at a pheripheral portion of an element formation region is controlled, which comprises the steps of:

forming an antietching mask on a semiconductor substrate through an antioxidant film, said antietching mask being formed except at a prospective field region;

selectively etching a prospective field region to form a groove;

depositing a field insulating film in said groove so as to have a flat surface; and then exposing said semiconductor substrate in an oxygen atmosphere while said antioxidant film is left thereon, thereby locally oxidizing a surface portion of said semiconductor substrate surrounding said element formation region; and forming a desired element in said element formation region isolated by said field insulating film.

2. A method according to claim 1, wherein said step of depositing a field insulating film comprises the steps of selectively forming a first insulating film with a narrow groove around said element formation region using said antietching mask as a liftoff material, depositing a second insulating film so as to cover an entire surface which includes said narrow groove, applying a flowable material film to a surface of said second insulating film so as to obtain a structure which has a flat surface, and uniformly etching said flowable material film and said first and second insulating film so as to leave said second insulating film only in said narrow groove.

3. A method according to claim 1, wherein said step of exposing said semiconductor substrate in an oxygen atmosphere comprises the step of forming an oxide film such that a peripheral portion of said oxide film has a thickness greater than a thickness of a central portion thereof by 0.1 to 0.2 μm.

4. A method according to claim 1, wherein said antioxidant film in the step of forming a antietching mask is formed through a thermal oxide film preliminarily formed on said semiconductor substrate.

* * * * *